United States Patent
Song et al.

(10) Patent No.: US 10,742,187 B2
(45) Date of Patent: *Aug. 11, 2020

(54) SYSTEM AND METHOD FOR DISTORTION LIMITING

(71) Applicant: Bose Corporation, Framingham, MA (US)

(72) Inventors: Zukui Song, Wellesley, MA (US); Michael S. Dublin, Arlington, MA (US); Christopher J. Cheng, Arlington, MA (US); Jeffery R. Vautin, Worcester, MA (US)

(73) Assignee: Bose Corporation, Framingham, MA (US)

(*) Notice: Subject to any disclaimer, the term of this patent is extended or adjusted under 35 U.S.C. 154(b) by 172 days.

This patent is subject to a terminal disclaimer.

(21) Appl. No.: 15/879,989

(22) Filed: Jan. 25, 2018

(65) Prior Publication Data

US 2018/0152167 A1    May 31, 2018

Related U.S. Application Data

(63) Continuation of application No. 14/918,145, filed on Oct. 20, 2015, now Pat. No. 9,917,565.

(51) Int. Cl.
*H03G 11/00* (2006.01)
*H04R 3/00* (2006.01)
(Continued)

(52) U.S. Cl.
CPC ............ *H03G 11/00* (2013.01); *H03G 5/165* (2013.01); *H04R 3/002* (2013.01); *H04R 3/007* (2013.01); *H04R 3/04* (2013.01); *H04R 2430/01* (2013.01)

(58) Field of Classification Search
CPC .......... H03G 11/00; H03G 5/165; H04R 3/04; H04R 3/002; H04R 3/007; H04R 2430/01;
(Continued)

(56) References Cited

U.S. PATENT DOCUMENTS 4,412,100 A * 10/1983 Orban .................. H03G 9/00
                                                         381/100
4,736,433 A *  4/1988 Dolby .................... H03G 9/025
                                                         381/106
(Continued)

OTHER PUBLICATIONS

CN Office Action dated Sep. 23, 2019 for CN Appln. 201680061395.3.

*Primary Examiner* — Akelaw Teshale
(74) *Attorney, Agent, or Firm* — Bose Corporation

(57) ABSTRACT

A system is provided for limiting distortion of an audio speaker. The system includes a first lowpass filter circuitry that is configured to receive a system input signal and generate a first lowpass filtered output signal. The system also includes a first limiter circuitry that is configured to limit the first lowpass filtered output signal. Limiting the first low pass filtered output signal includes reducing an amplitude of the first lowpass filtered output signal below a first predetermined threshold value, thereby to generate a first limited output signal. A second lowpass filter circuitry is configured to receive the first limited output signal and to generate a second lowpass filtered output signal.

15 Claims, 7 Drawing Sheets

(51) Int. Cl.
*H03G 5/16* (2006.01)
*H04R 3/04* (2006.01)

(58) Field of Classification Search
CPC ...... H04R 5/04; H04R 25/505; H04R 25/606; H04R 29/001; H04R 1/021; H04R 1/1083; H04R 1/2819; H04R 1/2842; H04R 1/288; H04R 1/30; H04R 1/347; H04R 2201/403; H04R 2410/05; H04R 2420/07; H04R 2440/05; H04R 2499/11; H04R 3/00; H04R 3/005; H04R 5/02; H04R 7/045; H04R 7/16; H04R 1/403; H04R 2201/405; H04R 2410/07; H04R 2430/03; H04R 2430/20; H04R 2460/01; H04R 2499/15; H04R 25/70; H04R 3/12; H04R 3/14
See application file for complete search history.

(56) References Cited

U.S. PATENT DOCUMENTS

| | | | | |
|---|---|---|---|---|
| 6,175,631 B1* | 1/2001 | Davis | ............ | H04R 5/04 381/17 |
| 6,337,999 B1* | 1/2002 | Orban | ............ | H03G 11/008 381/106 |
| 7,126,519 B1* | 10/2006 | Xu | ............ | H03M 1/0626 341/144 |
| 7,206,419 B1* | 4/2007 | Poletti | ............ | G10H 3/187 381/98 |
| 9,380,385 B1* | 6/2016 | Skinner | ............ | H04R 29/001 |
| 2002/0067414 A1* | 6/2002 | Tanji | ............ | H04N 5/202 348/254 |
| 2008/0118072 A1* | 5/2008 | Tsutsui | ............ | H04S 5/00 381/17 |
| 2008/0170719 A1* | 7/2008 | Shimura | ............ | H03G 5/16 381/94.1 |
| 2008/0175397 A1* | 7/2008 | Holman | ............ | H04R 3/08 381/55 |
| 2008/0199018 A1* | 8/2008 | Chen | ............ | H04R 5/033 381/61 |
| 2010/0150377 A1* | 6/2010 | Yoon | ............ | H04R 3/002 381/98 |
| 2010/0215192 A1* | 8/2010 | Minnaar | ............ | H04R 3/04 381/98 |
| 2011/0235824 A1* | 9/2011 | Lehnert | ............ | H03G 9/005 381/94.8 |
| 2012/0166190 A1* | 6/2012 | Lee | ............ | G10L 21/0208 704/233 |
| 2013/0051581 A1* | 2/2013 | Kawano | ............ | H04R 3/04 381/98 |
| 2014/0073280 A1* | 3/2014 | Mikhemar | ............ | H04B 1/10 455/307 |
| 2015/0304775 A1* | 10/2015 | Fujita | ............ | H04R 3/04 381/94.2 |

* cited by examiner

SYSTEM AND METHOD FOR DISTORTION LIMITING

CROSS-REFERENCE TO RELATED APPLICATIONS

This application is a continuation of U.S. application Ser. No. 14/918,145, filed Oct. 20, 2015, which is incorporated herein by reference in its entirety.

BACKGROUND

This disclosure relates to signal processing. More particularly, the present disclosure related to a system and method for distortion limiting.

In an audio system, when the amplitude of an audio signal exceeds the maximum voltage capability of the system the output signal stops abruptly at the voltage limit causing the tops and bottoms of the audio wave form to be, in effect, cut-off, resulting in clipping. To a worse extent, in the frequency range that is below the resonant frequency of a loudspeaker, for example a woofer, substantial distortion could be produced even when the speaker is driven by a voltage well below the maximum level. To address these problems, limiters are often used to limit the output voltage to speakers at high output levels.

A conventional limiter is a single band configuration that applies a limiting gain to all frequencies equally. Since music is generally a dynamic and broadband signal, such a configuration may cast unfavorable performance limitations to an audio system. For example, one prominent drawback with the conventional limiter is that there is often a compromise between bandwidth and maximum output sound level. More specifically, if the system engineer prefers louder sound for a speaker at maximum output, which is typically true, he/she would have to reduce the operation bandwidth of that speaker in order to meet the distortion performance threshold, as illustrated by line 102 of FIG. 1A. The bandwidth cut back is typically done by increasing the cut off frequency of the high pass filter in the system equalizations, which will effectively remove much of the bass content. As a result, a substantial amount of bass capability of the speaker cannot be utilized. On the other hand, if the system engineer prefers to retain the deeper bass frequencies, he/she would have to tune the limiter in a very aggressive way to lower the sound level at maximum output in order to meet the distortion performance requirement, as illustrated by line 104 of FIG. 1A.

SUMMARY

In one aspect, a system is provided for limiting distortion of an audio speaker. The system includes a first lowpass filter circuitry that is configured to receive a system input signal and generate a first lowpass filtered output signal. The system also includes a first limiter circuitry that is configured to limit the first lowpass filtered output signal. Limiting the first low pass filtered output signal includes reducing an amplitude of the first lowpass filtered output signal below a first predetermined threshold value, thereby to generate a first limited output signal. A second lowpass filter circuitry is configured to receive the first limited output signal and to generate a second lowpass filtered output signal.

Implementations may include one of the following features, or any combination thereof.

In some implementations, the system also includes a highpass filter circuitry that is configured to receive a system input signal and to generate a highpass filtered output signal. A second limiter circuitry is configured to limit the highpass filtered output signal. Limiting the highpass filtered output signal includes reducing an amplitude of the highpass filtered output signal below a second predetermined threshold value, thereby to generate a second limited output signal. A first combiner circuitry is configured to receive and combine respective signals (e.g., the first and second limited output signals) from the first limiter circuitry and the second limiter circuitry to provide a first combined output signal. The second lowpass filter circuitry is configured to filter the first combined output signal to generate the second lowpass filtered output signal. A third limiter circuitry is configured to limit the second lowpass filtered output signal. Limiting the second lowpass filtered output signal includes reducing an amplitude of the second lowpass filtered output signal below a third predetermined threshold value, thereby to provide a distortion limiting output signal.

In certain implementations, an allpass filter circuitry is configured to receive a signal (e.g., the second limited signal) from the second limiter circuitry and to generate an allpass filtered output signal, and a second combiner circuitry is configured to combine the second lowpass filtered output signal and the allpass filtered output signal to provide a second combined output signal. Limiting the second lowpass filtered signal includes limiting the second combined output signal.

In some examples, the system includes polarity circuitry arranged between the allpass filter circuitry and the second combiner circuitry, and configured to adjust a polarity of the allpass filtered output signal before transmission to the second combiner circuitry.

In certain examples, the system includes a first equalization circuitry that is configured to boost an amplitude of a first set of frequency components in the system input signal, and a second equalization circuitry that is configured to reduce the amplitude of the first set of frequency components in the distortion limiting output signal.

In some cases, the system also includes a highpass filter circuitry that is configured to receive a system input signal. The highpass filter circuitry is configured to generate a highpass filtered output signal and to provide the highpass filtered output signal to the second limiter circuitry. The system may also include a second limiter circuitry configured to limit the highpass filtered output signal. Limiting the highpass filtered output signal includes reducing an amplitude of the highpass filtered output signal below a second predetermined threshold value, thereby to generate a second limited output signal. A first combiner circuitry is configured to combine the second lowpass filtered output signal with the output from the second limiter circuitry to provide a first combined output signal. A third limiter circuitry is configured to limit the first combined output signal. Limiting the first combined output signal includes reducing an amplitude of the first combined output signal below a third predetermined threshold value, thereby to provide a distortion limiting output signal.

In certain cases, the system can include a first equalization circuitry that is configured to boost an amplitude of a first set of frequency components in the system input signal, and a second equalization circuitry that is configured to reduce the amplitude of the first set of frequency components in the second filtered output signal.

Another aspect provides a method for limiting distortion of an audio speaker. The method includes lowpass filtering a system input signal to provide a first lowpass filtered output signal. The first lowpass filtered output signal is limited to provide a first limited output signal. Limiting the first lowpass filtered output signal includes reducing an amplitude of the first lowpass filtered output signal below a first predetermined threshold value. The method also includes lowpass filtering the first limited output signal to provide a second lowpass filtered output signal.

Implementations may include one of the above and/or below features, or any combination thereof.

In some implementations, the second lowpass filtered output signal is transduced to acoustic energy via an electro-acoustic transducer.

In certain implementations, the system input signal is highpass filtered to provide a highpass filtered output signal. The highpass filtered output signal is limited to provide a second limited output signal. Limiting the highpass filtered output signal includes reducing an amplitude of the highpass filtered output signal below a second predetermined threshold value. The first limited output signal and the second limited output signal are combined to provide a first combined output signal. The step of lowpass filtering the first limited output signal includes lowpass filtering the first combined output signal to provide the second lowpass filtered output signal. The second lowpass filtered output signal is limited to provide a distortion limiting output signal. Limiting the second lowpass filtered output signal includes reducing an amplitude of the second lowpass filtered output signal below a third predetermined threshold value.

Methods can include transducing the distortion limiting output signal to acoustic energy via an electro-acoustic transducer.

In some examples, the second limited output signal is allpass filtered to provide an allpass filtered output signal. The second lowpass filtered output signal and the allpass filtered output signal are combined to provide a second combined output signal. The step of limiting the second lowpass filtered output signal may include limiting the second combined output signal.

In certain examples, a polarity of the allpass filtered output signal is adjusted (e.g., reversed) to provide a polarity adjusted output signal. The step of combining the second lowpass filtered output signal and the allpass filtered output signal may include combining the second lowpass filtered output signal and the polarity adjusted output signal to provide the second combined output signal.

In some cases, the system input signal is equalized to boost an amplitude of a first set of frequency components in the system input signal, and the distortion limiting output signal is equalized to reduce the amplitude of the first set of frequency components in the distortion limiting output signal.

In certain cases, the system input signal is highpass filtered to provide a highpass filtered output signal. The highpass filtered output signal is then limited to provide a second limited output signal. Limiting the highpass filtered output signal includes reducing an amplitude of the highpass filtered output signal below a second predetermined threshold value. The second limited output signal and the second lowpass filtered output signal are combined to provide a first combined output signal. The first combined output signal is limited to provide a distortion limiting output signal. Limiting the first combined output signal includes reducing an amplitude of the first combined output signal below a third predetermined threshold value.

In yet another aspect, a system includes a first limiter circuitry, and a first lowpass filter circuitry that provides a first lowpass filtered output signal to the first limiter circuitry. The system also includes a second limiter circuitry, and a highpass filter circuitry that provides a highpass filtered output signal to the second limiter circuitry. A first combiner circuitry is configured to combine respective signals from the first and second limiter circuitry and provides a first combined output signal. A second lowpass filter circuitry receives the first combined output signal and generates a second lowpass filtered output signal. An allpass filter circuitry receives a signal from the second limiter circuitry and generates an allpass filtered output signal. A second combiner circuitry combines the second lowpass filtered output signal and the allpass filtered output signal to provide a second combined output signal. A third limiter circuitry receives the second combined output signal and provides a distortion limiting output signal.

Implementations may include one of the above and/or below features, or any combination thereof.

In some implementations, the system also includes polarity circuitry that is arranged between the allpass filter circuitry and the second combiner circuitry. The polarity circuitry is configured to adjust (e.g., reverse) a polarity of the second lowpass filtered output signal before transmission to the second combiner circuitry.

In certain implementations, the first limiter circuitry includes a first limiter, the second limiter circuitry includes a second limiter, and the first and second limiters are tuned independently with each having its own threshold and time constants.

In some examples, the allpass filter circuitry includes a 1st order all pass filter or a 2nd order allpass filter.

Another aspect features a method for limiting distortion of an audio speaker. The method includes: receiving a system input signal at a first lowpass filter circuitry; generating a first lowpass filtered output signal at the first lowpass filter circuitry; receiving the first lowpass filtered output signal at a first limiter circuitry; limiting the first lowpass filtered output signal via the first limiter circuitry to generate a first limited output signal. Limiting the first lowpass filtered output signal includes reducing an amplitude of the first lowpass filtered output signal below a first predetermined threshold value. The system input signal is received at a highpass filter circuitry and a highpass filtered output signal is generated at the highpass filter circuitry. The highpass filtered output signal is limited at the second limiter circuitry to generate a second limited output signal. Limiting the highpass filtered output signal includes reducing an amplitude of the highpass filtered output signal below a second predetermined threshold value. The first limited output signal and second limited output signal are combined to generate a first combined output signal. The first combined output signal is received at a second lowpass filter circuitry, and a second lowpass filtered output signal is generated at the second lowpass filter circuitry. The second limited output signal is received at an allpass filter circuitry, and an allpass filtered output signal is generated at the allpass filter circuitry. The second lowpass filtered output signal and the allpass filtered output signal are combined to generate a second combined output signal. The second combined output signal is limited via the third limiter circuitry to generate a distortion limiting output signal. Limiting the second combined output signal includes reducing an amplitude of the second combined output signal below a third predetermined threshold value.

Implementations may include one of the above and/or below features, or any combination thereof.

In some implementations, the method also includes receiving the distortion limiting output signal at an electro-acoustic transducer; and transducing the distortion limiting output signal to acoustic energy via the electro-acoustic transducer.

In certain implementations, the method includes reversing a polarity of the allpass filtered output signal using polarity circuitry provided between the allpass filter circuitry and the second combiner circuitry.

In some examples, at least one of the first lowpass filter circuitry, the second lowpass filter circuitry, and the highpass filter circuitry is configured as a 5th order Butterworth filter.

In certain examples, the allpass filter circuitry includes a 1st order allpass filter or a 2nd order allpass filter.

Other aspects, features, and advantages are in the description, drawings, and claims.

DETAILED DESCRIPTION

Figure 1A:
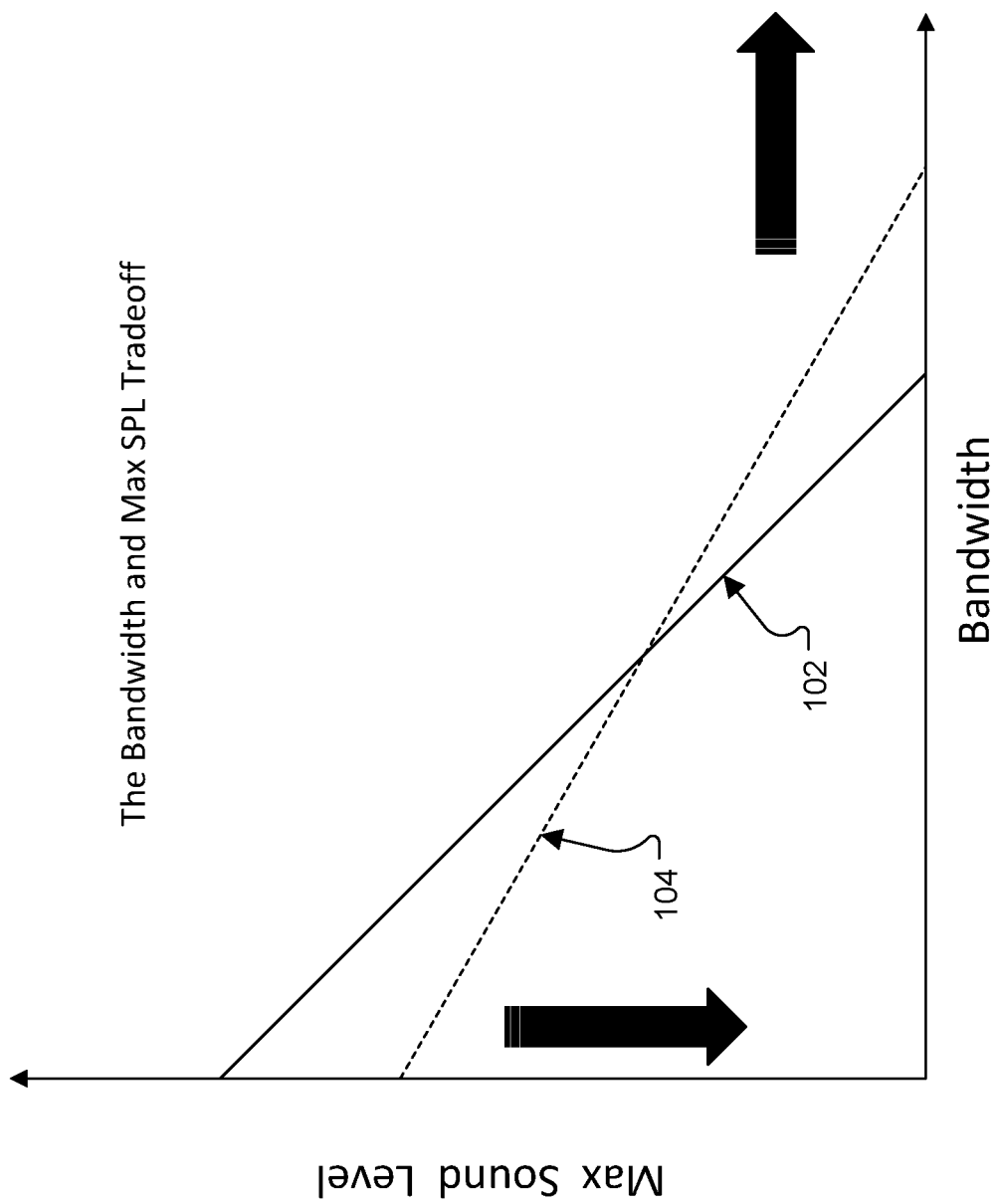
FIG. 1A is diagram illustrating a bandwidth and sound level tradeoff for an audio system with a conventional limiter for limiting distortion in the audio system.
Figure 1B:
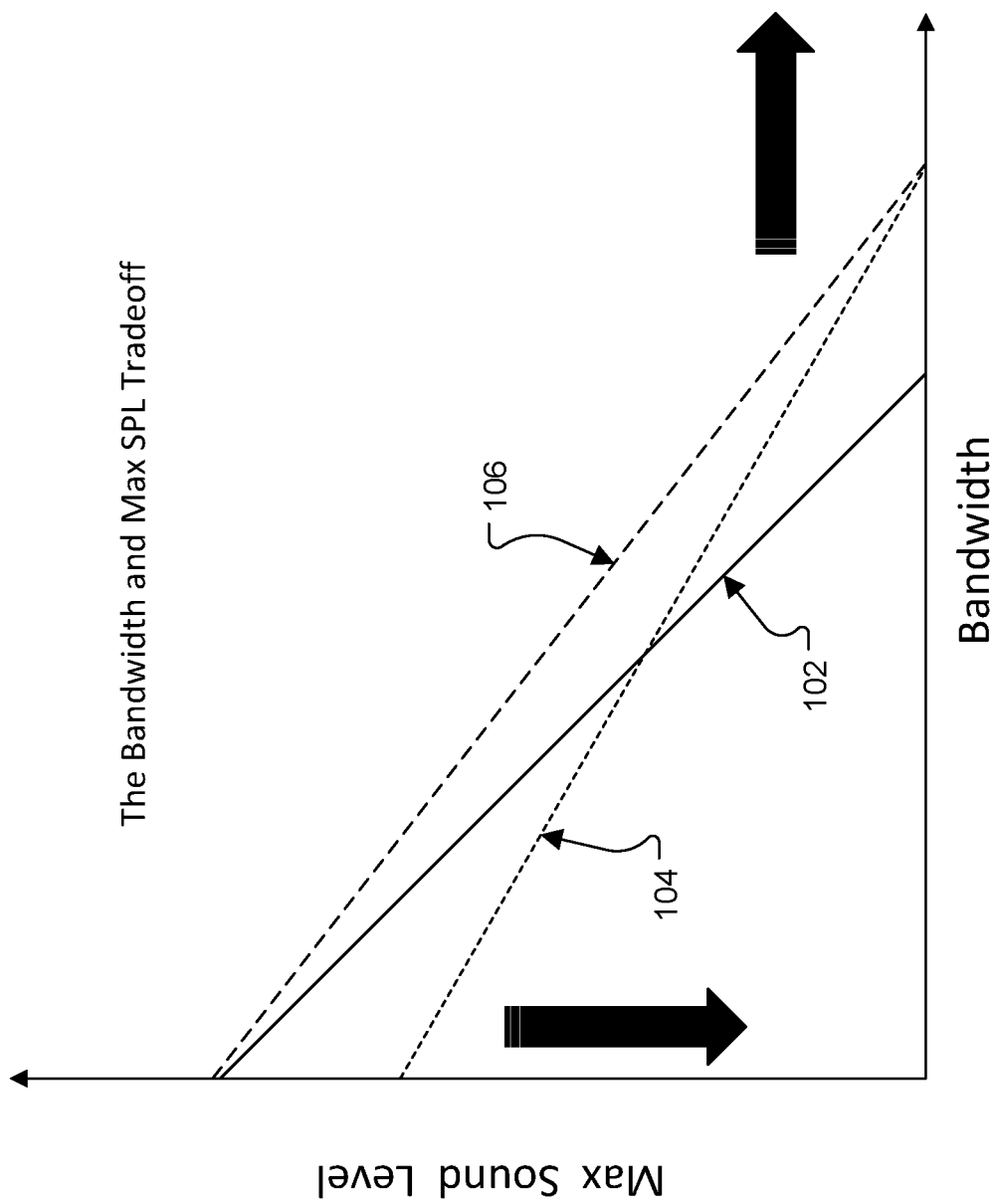
FIG. 1B is diagram illustrating the performance of the distortion limiting system of the present disclosure as compared to the conventional limiters.

This disclosure is based on a distortion limiting system that is proposed to help resolve the compromise between bandwidth and maximum sound level (max SPL). The idea is to substantially extend the bass frequency range at normal volume levels and maintain the sound level at maximum output as compared to conventional limiters, as illustrated by line 106 of FIG. 1B. This could lead to significant performance improvement, especially for audio systems which do not include a dedicated bass box.

As used in any embodiment described herein, the term "circuitry" may comprise, for example, singly or in any combination, digital circuitry, analog circuitry, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

As used in any embodiment described herein, the terms "coupled" and "operatively connected", as used herein, may refer to one or more components that are configured to communicate a signal. The coupled components may be physically connected by electrically conductive wire or by optically transmissive fiber, or may be communicatingly coupled by a wireless technique such as infrared or radio frequency (RF), or other signal communication techniques. Similarly, the term "signal line" as used herein, may refer to any transmissive path, including electrically conductive wire, optically transmissive fiber, a wireless communication path, or other type of signal transmission path, for transmitting analog or digitally encoded signals.

As used herein "limiting" is distinguished from "clipping." Clipping abruptly stops an audio signal from going over a maximum voltage limit, and so the tops and bottoms of the audio wave form are, in effect, cut-off. This is something that inevitably produces strong harmonic distortion. The result is a system that is entirely linear up to the clipping level, and then horribly non-linear, so signals slightly lower than the clipping level are passed unaffected, while those at, or higher than, the clipping level are mangled, resulting in the addition of complex additional harmonics that were not present in the original.

Limiting is an altogether much more controlled business, where a loud signal is briefly attenuated, specifically to avoid clipping. The result is a system that is linear up to the limiting level, above which the waveform is reduced in amplitude but more or less retains its original shape, and thus remains harmonically intact.

Figure 2A:
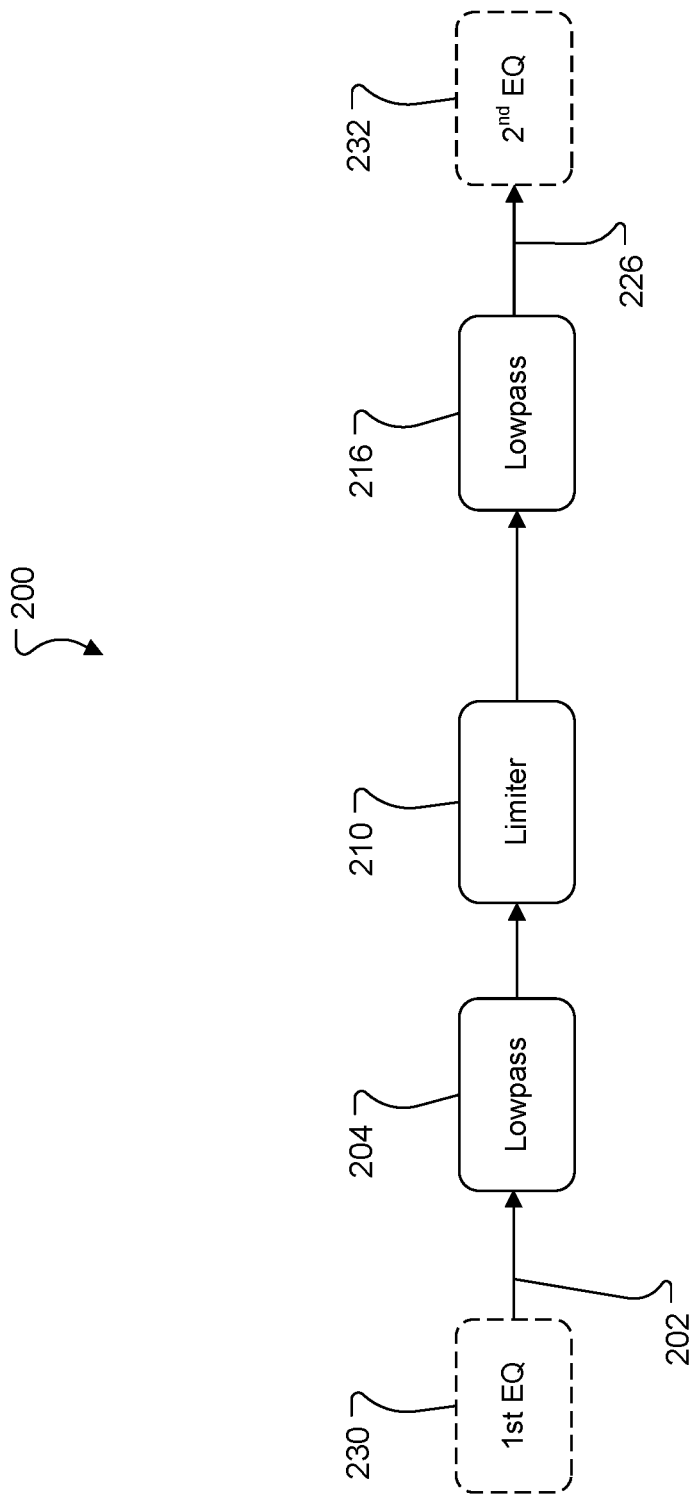
FIG. 2A depicts a block diagram showing a first embodiment of a distortion limiting system for reducing distortion in the output of an audio system.

Referring to FIG. 2A, an embodiment of the present disclosure depicting distortion limiting system 200 is provided. The system 200 of FIG. 2A is shown as a block diagram. There may or may not be physical elements corresponding to each of the elements of FIG. 2A. For example, a system input signal 202 may be received at one or more input terminals (not shown), which may be implemented as a single physical input terminal receiving a stream of signals. Elements such as the lowpass filtering circuitries, highpass filtering circuitries, or others, may be implemented by a digital signal processor (DSP) operating on digitally encoded data. Additionally and or alternatively, other circuit arrangements may produce substantially the same result as the arrangement of FIG. 2A. More than one of the blocks may be represented by a single element, or blocks may be consolidated.

In some embodiments, distortion limiting system 200 may be configured to receive a system input signal 202, which may be provided by an amplifier (not shown) or alternative device through one or more signal lines. The input signal 202 may be provided to first lowpass filter circuitry 204. The first lowpass filter circuitry 204 may be operatively connected to first limiter circuitry 210, which may be configured to attenuate the amplitude of the signal entering the first limiter circuitry 210 if it exceeds a predefined threshold. The output of the first limiter circuitry 210 passed through second lowpass filter circuitry 216 to provide a distortion limiting output signal 226, which can be transduced to acoustic energy via an electro-acoustic transducer.

In some embodiments, the system 200 may include first and second equalization circuitry 230, 232. The first equalization circuitry 230 is configured to perform an equalization operation on the input signal before it is provided to the first lowpass filter circuitry 204 and/or the highpass filter circuitry 206. In that regard, the first equalization circuitry 230 may be configured to boost (i.e., increase the magnitude of) certain frequencies in the input signal 202 to cause the limiter circuitry downstream to limit those frequencies at a lower signal level than they ordinarily would be limited. The second equalization circuitry 232 is arranged to equalize the output signal 226. The second equalization circuitry 232 is complimentary to the first equalization circuitry 230 and cuts (i.e., reduces the magnitude of) the very same frequencies that were boosted upstream by the first equalization circuitry 230. This equalization circuitry enables the system to effectively have different limiting thresholds for different frequency ranges.

Figure 2B:
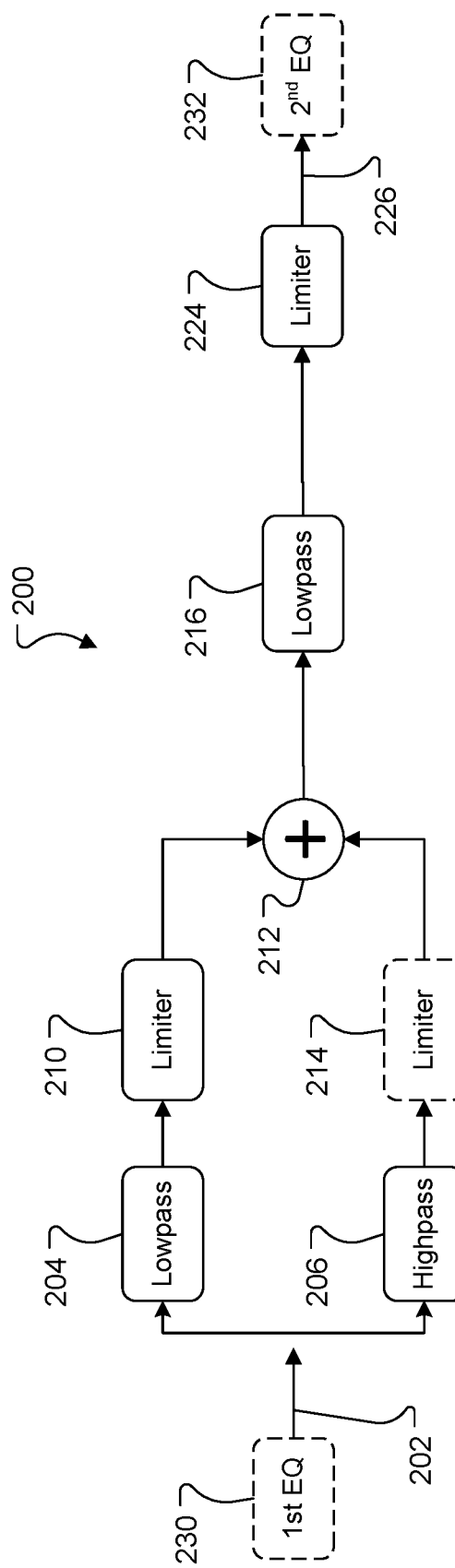
FIG. 2B depicts a block diagram showing a second embodiment of a distortion limiting system for reducing distortion in the output of an audio system.

In some embodiments, the high frequency content of the input signal 202 may also be limited to attenuate the amplitude of the high frequency content. This can be done separately from the limiting of the low frequency content. The limited high frequency content and the limited low frequency content can then be combined to provide an output signal that includes the full frequency band of the input signal. For example, in the embodiment illustrated in FIG. 2B, the system 200 has a high frequency path that includes highpass filter circuitry 206. The highpass filter circuitry 206 may receive system input signal 202 through one or more signal lines. Optionally, the highpass filter circuitry 206 may be operatively connected to a second limiter circuitry 214, which may be configured to attenuate the amplitude of the highpass filtered signal entering the second limiter circuitry 214 if it exceeds a predefined threshold.

In some cases, first combiner circuitry 212 may be operatively connected to the first limiter circuitry 210, the highpass filter circuitry 206 (or the second limiter circuitry 214 when utilized), and second lowpass filter circuitry 216. The second lowpass filter circuitry 216 may be operatively connected to third (master) limiter circuitry 224. The first combiner circuitry 212 may receive an input from each of the first limiter circuitry 210 and the second limiter circuitry 214—or directly form the highpass filter circuitry 206 when the second limiter circuitry is not utilized. The output of first combiner circuitry 212 is provided to the second lowpass filter circuitry 216. The output of second lowpass filter circuitry 216 is provided to the third (master) limiter circuitry 224 to generate the distortion limiting output signal 226.

Figure 2C:
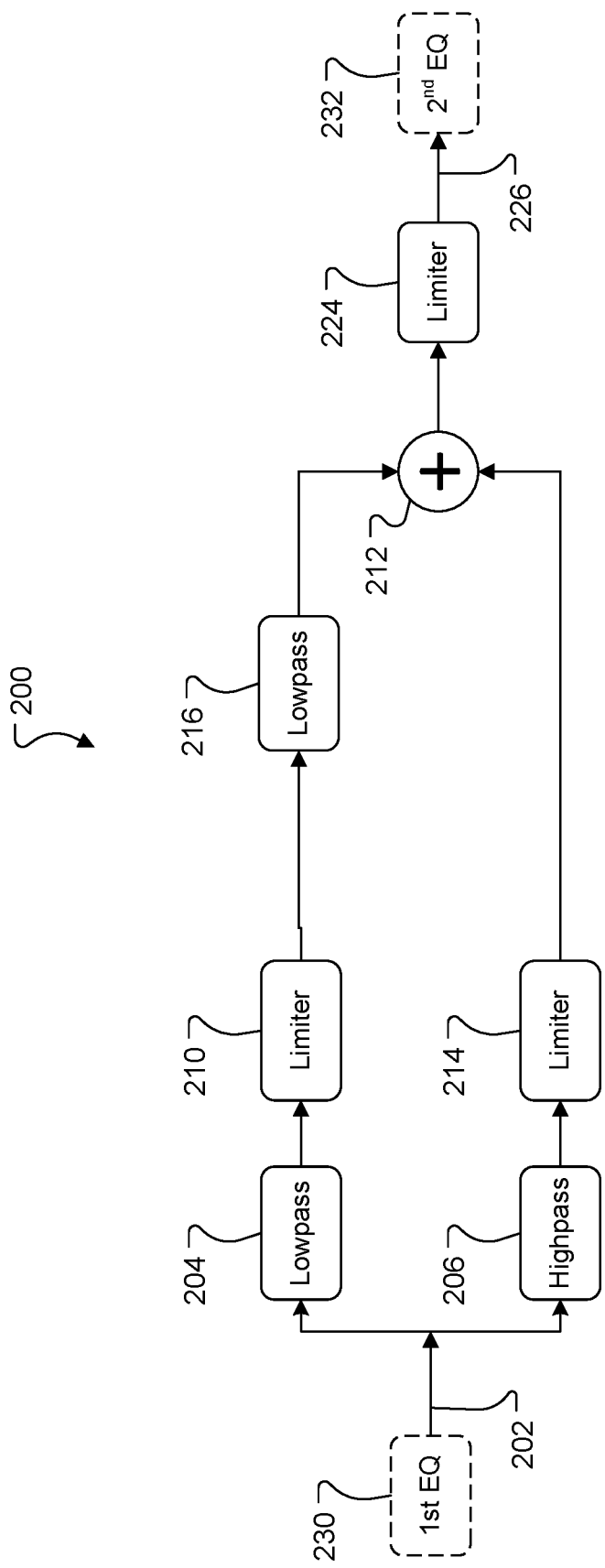
FIG. 2C depicts a block diagram showing a third embodiment of a distortion limiting system for reducing distortion in the output of an audio system.

Alternatively, as illustrated in FIG. 2C, the first combiner circuitry 212 may be configured to the receive an input from the second lowpass filter circuitry 216 and the second limiter circuitry 214, such that the high frequency content and the low frequency content is combined after the second lowpass filtering operation is performed. The output of the first combiner circuitry 212 may then be provided to the third limiter circuitry 224 to generate the distortion limiting output signal 226.

Figure 2D:
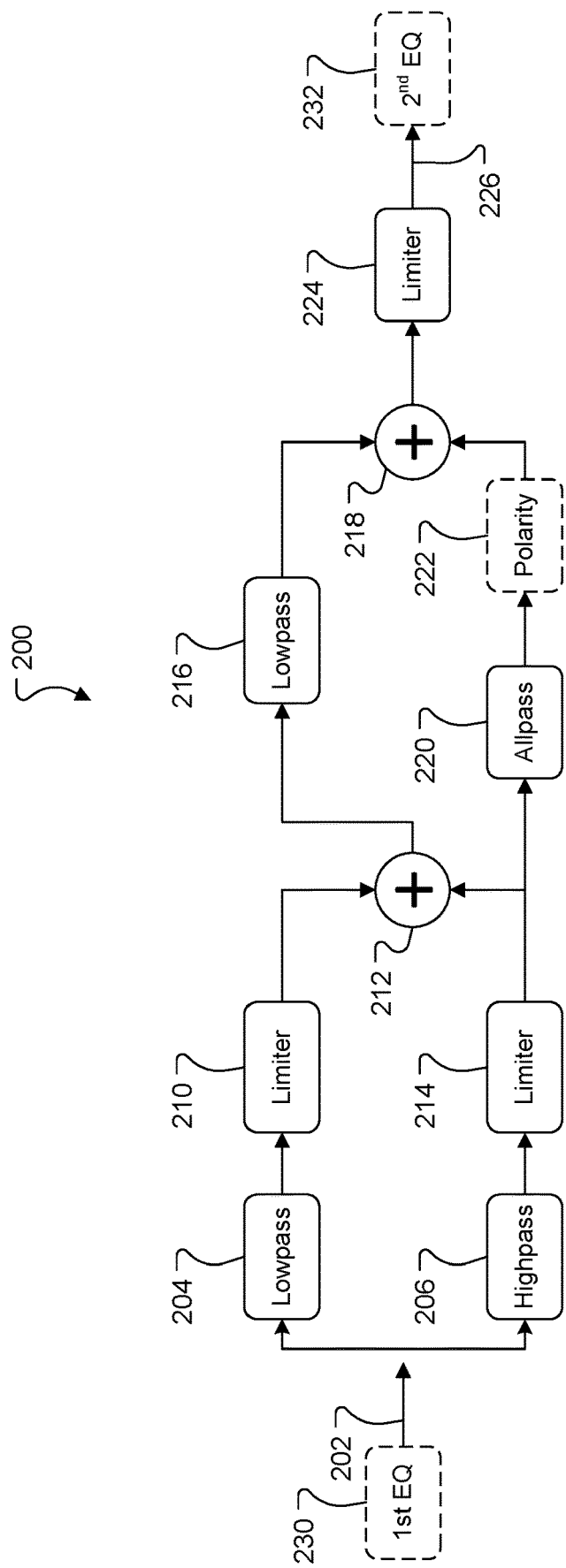
FIG. 2D depicts a block diagram showing a fourth embodiment of a distortion limiting system for reducing distortion in the output of an audio system

In some cases, the second limiter circuitry 214 may be operatively connected to allpass filter circuitry 220, as shown in FIG. 2D. The allpass filter circuitry 220 may be operatively connected to second combiner circuitry 218, either directly or via polarity circuitry 222. The second combiner circuitry 218 may receive an input from each of the second lowpass filter 216 and the polarity circuitry 222. The output of second combiner circuitry 218 is provided to third limiter circuitry 224.

In the embodiment illustrated in FIG. 2D, the input signal 202 is band split into two frequency ranges one for the bass region, via the first lowpass filter 204, and the other one for all higher frequencies, via the highpass filter 206. Each band has its own limiter (i.e., first and second limiter circuitry 210, 214) that works independently from the other. The output of the two frequency bands are summed back up to form a full band signal which is lowpassed again, via the second lowpass filter circuitry 216, to remove the harmonic distortions from the limiting processes. The highpass filtered signal is phase adjusted by the allpass filter circuitry 220 and then summed up again with the output of the second lowpass filter circuitry 216. Finally, the summed signal goes through a master limiter, provided by third limiter circuitry 224, for further protections. In that regard, the output of the second combiner circuitry 218 can be clipped and cause new distortion. The third limiter circuitry 224 helps to prevent such events.

One or more of the first lowpass filter circuitry 204, the second lowpass filter circuitry 216, and the highpass filter circuitry 206 may be configured as a Butterworth filter. However, numerous other filter types may be used without departing from the scope of this disclosure. Some of these may include, but are not limited to, Chebyshev, Elliptic, Bessel, Gaussian, Legendre, Linkwitz-Riley, etc.

In some embodiments, one or more of the first lowpass filter circuitry 204, the second lowpass filter circuitry 216, the highpass filter circuitry 206, and the allpass filter circuitry 220 may have the same or substantially similar corner frequencies. For the purposes of this discussion, the corner frequency may refer to the frequency at which attenuation begins to increase sharply; or for the allpass filter, its corner frequency may be where its phase has traversed half of its full phase change (for 1st order, that phase is 90 degrees; for 2nd order, that phase is 180 degrees).

Any or all of the filtering circuitries described herein, such as the first lowpass filtering circuitry 204 and the highpass filtering circuitry 206, may be configured as odd ordered filters, which may include, but are not limited to, 3rd or 5th order filters. Other configurations are also within the scope of the present disclosure.

The two limiters in the lowpass and highpass branches (i.e., the first limiter circuitry 210 and the second limiter circuitry 214, respectively) are tuned independently each with its own threshold and time constants. In some embodiments, the tuning parameters of the third limiter circuitry 224 can be set to be the same as in the second limiter circuitry 214.

Figure 3:
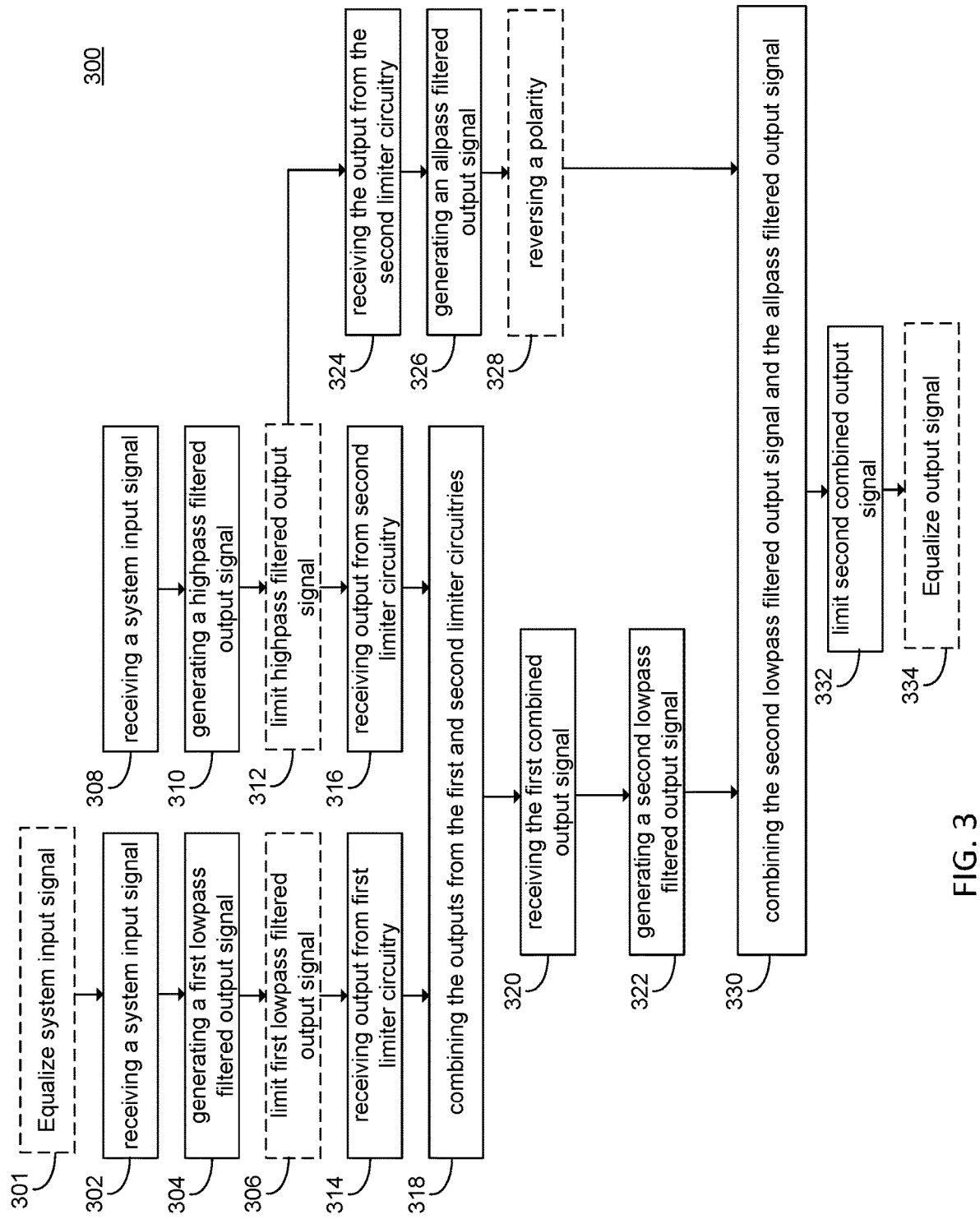
FIG. 3 depicts a flowchart showing operations associated with a method consistent with the embodiment of FIG. 2D.

Referring to FIG. 3 and in operation, a method 300 for limiting the distortion of an audio speaker may include receiving 302 the system input signal 202 at the first lowpass filter circuitry 204. In some cases, the system input signal 202 may be an equalized 301, prior to receipt, in order to boost a set of frequency components in the system input signal 202, thereby to cause a downstream limiting operation to limit those frequencies at a lower signal level than they ordinarily would be limited The system input signal 202 may be transmitted along one or more signal lines from another device, e.g. an amplifier, to the first lowpass filter circuitry 204. The first lowpass filter circuitry 204 may receive the system input signal 202 and may generate 304 a first lowpass filtered output signal. The first lowpass filtered output signal may be transmitted along one or more signal lines to the first limiter circuitry 210. The first limiter circuitry 210 may limit 306, i.e., reduce the amplitude, of the first lowpass filtered output signal to lower it below a predetermined threshold value to provide a first limited output signal. Additionally or alternatively, the first lowpass filtered output signal may be transmitted directly to the first combiner circuitry 212, such as when the first limiter circuitry 210 determines that no limiting is necessary.

The method 300 may further include receiving 308 the system input signal 202 at the highpass filter circuitry 206. The highpass filter circuitry 206 may generate 310 a highpass filtered output signal and may transmit the highpass filtered output signal to second limiter circuitry 214. The second limiter circuitry 214 may limit 312, i.e., reduce the amplitude, of the highpass filtered output signal to lower it below a predetermined threshold value to provide a second limited output signal. Additionally or alternatively, the highpass filtered output signal may be transmitted directly to first combiner circuitry 212, such as when the second limiter circuitry 214 determines that no limiting is necessary.

The first combiner circuitry 212 may receive 314, 316 the outputs from the first and second limiter circuitry 210, 214, which may be combined 318 to generate a first combined output signal. Combining 318 the outputs from the first and second limiters 210, 214 may include adding or subtracting the two signals.

The first combined output signal may be transmitted by first combiner circuitry 212, along one or more signal lines, to the second lowpass filter circuitry 216. The second lowpass filter circuitry 216 may receive 320 the first combined output signal and may generate 322 a second lowpass filtered output signal. The second lowpass filter circuitry 216 may provide the second lowpass filtered output signal to the second combiner circuitry 218.

Along the highpass branch, method 300 may further include receiving 324 the output of the second limiter circuitry at the allpass filter circuitry 220. As discussed above, the allpass filter circuitry 220 may be configured in a number of different arrangements, e.g. as a 1st order filter, 2nd order filter, etc. The allpass filter circuitry 220 may adjust the phase of the output of the second limiter circuitry and thereby generate 326 an allpass filtered output signal. The allpass filtered output signal may be transmitted from the allpass filter circuitry 220 to the polarity circuitry 222. The polarity circuitry 222 may reverse the polarity 328 of the allpass filtered output signal before transmission to the second combiner circuitry 218. The second combiner circuitry 218 may receive and combine 330 the second lowpass filtered output signal and the allpass filtered output signal in order to generate a second combined output signal.

The second combiner circuitry 218 may transmit the second filtered output signal to the third limiter circuitry 224. The third limiter circuitry 224 may limit 332, i.e., reduce the amplitude, of the second combined output signal to lower it below a predetermined threshold value in order to generate a distortion limiting output signal 226, which can be transduced via an electro-acoustic transducer. In some cases, the distortion limiting output signal 226 may be equalized 334 before it is transduced in order to reduce the amplitude of a set of frequency components in the distortion limiting output signal 226, such as when the same set of frequency components is boosted in the system input signal 202. Such complimentary equalization can enable different limiting thresholds for different frequency ranges.

A number of embodiments have been described. Nevertheless, it will be understood that additional modifications may be made without departing from the scope of the inventive concepts described herein, and, accordingly, other embodiments are within the scope of the following claims.

What is claimed is:

1. A system for limiting distortion of an audio speaker, the system comprising:
   a first lowpass filter circuitry configured to receive a system input signal and generate a first lowpass filtered output signal;
   a first limiter circuitry configured to limit the first lowpass filtered output signal, wherein limiting the first low pass filtered output signal comprises reducing an amplitude of the first lowpass filtered output signal below a first predetermined threshold value, thereby to generate a first limited output signal;
   a highpass filter circuitry configured to receive the system input signal, the highpass filter circuitry configured to generate a highpass filtered output signal;
   a second limiter circuitry configured to limit the highpass filtered output signal, wherein limiting the highpass filtered output signal comprises reducing an amplitude of the highpass filtered output signal below a second predetermined threshold value, thereby to generate a second limited output signal;
   a first combiner circuitry configured to receive and combine respective signals from the first limiter circuitry and the second limiter circuitry to provide a first combined output signal; and
   a second lowpass filter circuitry configured to receive the first combined output signal and to generate a second lowpass filtered output signal.

2. The system of claim 1, further comprising:
   a third limiter circuitry configured to limit the second lowpass filtered output signal, wherein limiting the second lowpass filtered output signal comprises reducing an amplitude of the second lowpass filtered output signal below a third predetermined threshold value, thereby to provide a distortion limiting output signal.

3. The system of claim 2, further comprising:
   an allpass filter circuitry configured to receive a signal from the second limiter circuitry and to generate an allpass filtered output signal;
   a second combiner circuitry configured to combine the second lowpass filtered output signal and the allpass filtered output signal to provide a second combined output signal,
   wherein limiting the second lowpass filtered signal comprises limiting the second combined output signal.

4. The system of claim 3, further comprising polarity circuitry arranged between the allpass filter circuitry and the second combiner circuitry, and configured to adjust a polarity of the allpass filtered output signal before transmission to the second combiner circuitry.

5. The system of claim 2, further comprising
   a first equalization circuitry configured to boost an amplitude of a first set of frequency components in the system input signal; and
   a second equalization circuitry configured to reduce the amplitude of the first set of frequency components in the distortion limiting output signal.

6. The system of claim 1, further comprising
   a first equalization circuitry configured to boost an amplitude of a first set of frequency components in the system input signal; and
   a second equalization circuitry configured to reduce the amplitude of the first set of frequency components in the second filtered output signal.

7. A system for limiting distortion of an audio speaker, the system comprising:
   a first lowpass filter circuitry configured to receive a system input signal and generate a first lowpass filtered output signal;
   a first limiter circuitry configured to limit the first lowpass filtered output signal, wherein limiting the first low pass filtered output signal comprises reducing an amplitude of the first lowpass filtered output signal below a first predetermined threshold value, thereby to generate a first limited output signal;
   a highpass filter circuitry configured to receive the system input signal, the highpass filter circuitry configured to generate a highpass filtered output signal;
   a first combiner circuitry configured to receive and combine respective signals from the first limiter circuitry and the highpass filter circuitry to provide a first combined output signal;

a second lowpass filter circuitry configured to receive the first combined output signal and to generate a second lowpass filtered output signal; and a master limiter circuitry configured to limit the second lowpass filtered output signal, wherein limiting the second lowpass filtered output signal comprises reducing an amplitude of the second lowpass filtered output signal below a master threshold value, thereby to provide a distortion limiting output signal.

8. The system of claim 7, further comprising a first equalization circuitry configured to boost an amplitude of a first set of frequency components in the system input signal; and a second equalization circuitry configured to reduce the amplitude of the first set of frequency components in the distortion limiting output signal.

9. A method for limiting distortion of an audio speaker, the method comprising:

lowpass filtering a system input signal to provide a first lowpass filtered output signal;

limiting the first lowpass filtered output signal to provide a first limited output signal, wherein limiting the first lowpass filtered output signal comprises reducing an amplitude of the first lowpass filtered output signal below a first predetermined threshold value;

highpass filtering the system input signal to provide a highpass filtered output signal;

combining the first limited output signal and the highpass filtered output signal to provide a first combined output signal lowpass filtering the first combined output signal to provide a second lowpass filtered output signal; and limiting the second lowpass filtered output signal to provide a distortion limiting output signal, wherein limiting the second lowpass filtered output signal comprises reducing an amplitude of the second lowpass filtered output signal below a third predetermined threshold value.

10. The method of claim 9, further comprising: transducing the distortion limiting output signal to acoustic energy via an electro-acoustic transducer.

11. The method of claim 9, further comprising: transducing the distortion limiting output signal to acoustic energy via an electro-acoustic transducer.

12. The method of claim 9, further comprising:

allpass filtering the second limited output signal to provide an allpass filtered output signal; and combining the second lowpass filtered output signal and the allpass filtered output signal to provide a second combined output signal, wherein limiting the second lowpass filtered output signal comprises limiting the second combined output signal.

13. The method of claim 12, further comprising reversing a polarity of the allpass filtered output signal to provide a polarity adjusted output signal, wherein combining the second lowpass filtered output signal and the allpass filtered output signal comprises combining the second lowpass filtered output signal and the polarity adjusted output signal to provide the second combined output signal.

14. The method of claim 12, further comprising:

equalizing the system input signal to boost an amplitude of a first set of frequency components in the system input signal; and equalizing the distortion limiting output signal to reduce the amplitude of the first set of frequency components in the distortion limiting output signal.

15. The method of claim 9, further comprising:

limiting the highpass filtered output signal to provide a second limited output signal, wherein limiting the highpass filtered output signal comprises reducing an amplitude of the highpass filtered output signal below a second predetermined threshold value;

wherein combining the first limited output signal and the highpass filtered output signal to provide the first combined output signal comprises combining the first limited output signal and the second limited output signal to provide the first combined output signal;

limiting the first combined output signal to provide a distortion limiting output signal, wherein limiting the first combined output signal comprises reducing an amplitude of the first combined output signal below a third predetermined threshold value.

* * * * *